(12) United States Patent
Darling et al.

(10) Patent No.: US 11,401,385 B2
(45) Date of Patent: Aug. 2, 2022

(54) ORDERED NANOSCALE DOMAINS BY INFILTRATION OF BLOCK COPOLYMERS

(71) Applicant: UCHICAGO ARGONNE, LLC, Chicago, IL (US)

(72) Inventors: Seth B. Darling, Chicago, IL (US); Jeffrey W. Elam, Elmhurst, IL (US); Yu-Chih Tseng, Westmont, IL (US); Qing Peng, Downers Grove, IL (US)

(73) Assignee: UChicago Argonne, LLC, Chicago, IL (US)

( * ) Notice: Subject to any disclaimer, the term of this patent is extended or adjusted under 35 U.S.C. 154(b) by 137 days.

(21) Appl. No.: 16/721,667

(22) Filed: Dec. 19, 2019

(65) Prior Publication Data

US 2020/0140622 A1     May 7, 2020

Related U.S. Application Data

(62) Division of application No. 15/332,335, filed on Oct. 24, 2016, now Pat. No. 10,577,466, which is a
(Continued)

(51) Int. Cl.
*C08G 83/00*     (2006.01)
*H01L 21/027*    (2006.01)
(Continued)

(52) U.S. Cl.
CPC .............. *C08G 83/001* (2013.01); *C08F 8/42* (2013.01); *H01G 9/02* (2013.01); *H01J 9/025* (2013.01);
(Continued)

(58) Field of Classification Search
CPC .............................. C08F 8/42; C08G 83/001
See application file for complete search history.

(56) References Cited

U.S. PATENT DOCUMENTS 6,162,591 A     12/2000   Gao et al.
7,163,641 B2    1/2007    Donohoe et al.
(Continued)

FOREIGN PATENT DOCUMENTS

WO    WO-2008/135749 A1    11/2008

OTHER PUBLICATIONS

Adamo & Barone, "Toward reliable density functional methods without adjustable parameters: The PBE0 model," The Journal of Chemical Physics 110(13), pp. 6158-6170 (1999).
(Continued)

*Primary Examiner* — Marks Kaucher
(74) *Attorney, Agent, or Firm* — Foley & Lardner LLP

(57) ABSTRACT

A method of preparing tunable inorganic patterned nanofeatures by infiltration of a block copolymer scaffold having a plurality of self-assembled periodic polymer microdomains. The method may be used sequential infiltration synthesis (SIS), related to atomic layer deposition (ALD). The method includes selecting a metal precursor that is configured to selectively react with the copolymer unit defining the microdomain but is substantially non-reactive with another polymer unit of the copolymer. A tunable inorganic features is selectively formed on the microdomain to form a hybrid organic/inorganic composite material of the metal precursor and a co-reactant. The organic component may be optionally removed to obtain an inorganic feature s with patterned nanostructures defined by the configuration of the microdomain.

20 Claims, 6 Drawing Sheets

Related U.S. Application Data division of application No. 13/209,190, filed on Aug. 12, 2011, now Pat. No. 9,487,600.

(60) Provisional application No. 61/374,349, filed on Aug. 17, 2010.

(51) Int. Cl.

| | |
|---|---|
| H01M 50/446 | (2021.01) |
| C08F 8/42 | (2006.01) |
| H01G 9/02 | (2006.01) |
| H01J 9/02 | (2006.01) |
| H01L 51/42 | (2006.01) |
| H01L 51/44 | (2006.01) |
| H01M 10/0565 | (2010.01) |

(52) U.S. Cl.
CPC ...... *H01L 21/0271* (2013.01); *H01L 51/4213* (2013.01); *H01L 51/441* (2013.01); *H01M 10/0565* (2013.01); *H01M 50/446* (2021.01); *H01M 2300/0082* (2013.01)

(56) References Cited

U.S. PATENT DOCUMENTS

| | | | |
|---|---|---|---|
| 7,399,709 B1 | 7/2008 | Lin et al. | |
| 8,900,467 B1 | 12/2014 | Chapuis et al. | |
| 8,986,562 B2 | 3/2015 | Zafiropoulo et al. | |
| 9,416,447 B2 | 8/2016 | Arora et al. | |
| 9,487,600 B2 | 11/2016 | Darling et al. | |
| 9,684,234 B2 | 6/2017 | Darling et al. | |
| 2005/0082543 A1* | 4/2005 | Alizadeh | G02B 6/1225 257/79 |
| 2005/0103748 A1 | 5/2005 | Yamaguchi et al. | |
| 2006/0231525 A1 | 10/2006 | Asakawa et al. | |
| 2009/0101985 A1 | 4/2009 | Fuller et al. | |
| 2009/0181171 A1 | 7/2009 | Cheng et al. | |
| 2010/0092873 A1 | 4/2010 | Sills et al. | |
| 2010/0248476 A1 | 9/2010 | Sera et al. | |
| 2011/0206905 A1 | 8/2011 | Buriak et al. | |
| 2012/0046421 A1 | 2/2012 | Darling et al. | |
| 2012/0241411 A1 | 9/2012 | Darling et al. | |
| 2013/0157409 A1 | 6/2013 | Vaidya et al. | |
| 2013/0207238 A1 | 8/2013 | Cooper et al. | |
| 2014/0024220 A1 | 1/2014 | Chang et al. | |

OTHER PUBLICATIONS

Amirtharaj & Kruder, "Double Patterning and Hyper-Numerical Aperture Immersion Lithography," retrieved from http://www.ece.umd.edu/class/enee416/GroupActivities/Lithography%20Presentation.pdf, 16 pages, accessed Nov. 17, 2011.

Amirtharaj et al. "Double Patterning and Hyper-Numerical Aperture Immersion Lithography" via http://www.ece.umd.edu/class/enee416/GroupActivities/Lithography%20Presentation.pdf; Nov. 17, 2011, 16 pages.

Atwood, et al., "Cyclic trimeric hydroxy, amido, phosphido, and arsenido derivatives of aluminum and gallium. X-ray structures of [tert-Bu2Ga(.mu.-OH)]3 and [tert-Bu2Ga(.mu.-NH2)]3," Organometallics 12(1), pp. 24-29 (1993).

Banerjee, et al., "Characterization of tin doped indium oxide films prepared by electron beam evaporation," Solar Energy Materials 13(1), pp. 11-23 (1986).

Varavelli, et al., "VDD scalability of FinFET SRAMs: Robustness of different design options against LER-induced variations," Solid-State Electronics 54(9), pp. 909-918 (2010).

Blum, et al., "Ab initio molecular simulations with numeric atom-centered orbitals," Computer Physics Communications 180(11), pp. 2175-2196 (2009).

Chai, "Ordering Functional Nanostructures via Self-Assembly of Block Copolymers," University of Alberta, 196 pages (2009).

Diaz, et al., "An experimentally validated analytical model for gate line-edge roughness (LER) effects on technology scaling," IEEE Electron Device Letters 22(6), pp. 287-289 (2001).

Dreeskornfeld, et al., "High Precision Etching of Si/Si02 on a High-Density Helicon Etcher for Nanoscale Devices," Journal of the Electrochemical Society 150(11), pp. G702-G706 (2003).

Elam, et al., "Atomic Layer Deposition of Indium Tin Oxide Thin Films Using Nonhalogenated Precursors," The Journal of Physical Chemistry C 112(6), pp. 1938-1945 (2008).

Endo, et al., "High Sensitive Negative Silylation Process for 193nm Lithography," Microelectronic Engineering 53(1-4), pp. 485-488 (2000).

Final Office Actin on U.S. Appl. No. 13/427,619 dated Aug. 13, 2014, 20 pages.

Final Office Action on U.S. Appl. No. 13/427,619 dated Aug. 13, 2014, 22 pages.

Frase, et al., "CD Characterization of Nanostructures in SEM Metrology," Measurement Science and Technology 18(2), pp. 510-519 (2007).

Girardeaux & Pireaux, "Analysis of Poly(methyl methacrylate) (PMMA) byXPS," Surface Science Spectra 4, pp. 134-137 (1996).

Goldfarb, et al., "Effect of Thin-Film Imaging on Line Edge Roughness Transfer to Underlayers During Etch Processes," Journal of Vacuum Science & Technology B 22(2), pp. 647-653 (2004).

Goner, et al., "Low-Temperature Al2O3 Atomic Layer Deposition," Chemistry of Materials 16(4), pp. 639-645 (2004).

Hartney, et al., "Silylation Processes for 193-nm Excimer Laser Lithography," Advances in Resist Technology and Processing VI 1262, pp. 119-130 (1990).

Hiraoka & Mashita, "Ab initio study on the dimer structures of trimethylaluminum and dimethylaluminumhydride," Journal of Crystal Growth 145(1-2), pp. 473-477 (1994).

Hutton, et al., "Application of Plasmask R resist and the DESIRE process to lithography at 248 nm," Journal of Vacuum Science & Technology B 8(6), pp. 1502-1508 (1990).

Kim, et al., "Electrical, optical, and structural properties of indium-tin-oxide thin films for organic light-emitting devices," Journal of Applied Physics 86(11), pp. 6451-6461 (1999).

Koniziapasis, et al., "Optimized surface silylation of chemically amplified epoxidized photoresists for micromachining applications," Journal of Applied Polymer Science 117(4), pp. 2189-2195 (2010).

Kumar & Kasiviswanathan, "Role of oxygen vacancies in the high-temperature thermopower of indium oxide and indium tin oxide films," Semiconductor Science and Technology 24(2), 025028, 7 pages (2009),.

Kumar, "Indium Tin Oxide Films: State-of-the-Art In Synthesis and Properties," Materials Technology: Advanced Performance Materials 10(9-10), pp. 202-206 (1995).

Lee, et al., "Mobility Analysis of Surface Roughness Scattering in FinFET Devices," Solid-State Electronics 62(1), pp. 195-201 (2011).

Lopes & Jaeger, "Hierarchical Self-Assembly of Metal Nanostructures on Diblock Copolymer Scaffolds", Nature 414, pp. 735-738 (2001).

Lopez, et al., "XPS O 1s binding energies for polymers containing hydroxyl, ether, ketone and ester groups," Surface and Interface Analysis 17(5), pp. 267-272 (1991).

Lucas, et al., "Triple patterning in 10 nm mode metal lithography," SPIE Newsroom, 3 pages (2012).

Luo, et al., "Optical Characterization and Process Control of Top Surface Imaging," MRS Proceedings 584, pp. 183-188(2000).

Ma, et al., "Line Edge Roughness of Sub-100 nm Dense and Isolated Features: Experimental Study," Journal of Vacuum Science & Technology B 21(6), pp. 3124-3130 (2003).

Mason, et al., "Hydrolysis of tri-tert-butylaluminum: the first structural characterization of alkylalumoxanes [(R2Al)20]n and (RAIO)n," Journal of the American Chemical Society 115(12), pp. 4971-4984 (1993).

Mori, et al., "Reduction of line edge roughness in the top surface imaging process," Journal of Vacuum Science & Technology B 16(6), pp. 3739-3743 (1998).

Noda, et al., "Group Frequency Assignments for Major Infrared Bands Observed in Common Synthetic Polymers," Physical Properties of Polymers Handbook, pp. 395-406 (2007).

(56) References Cited

OTHER PUBLICATIONS

Non-Final Office Actin on U.S. Appl. No. 13/427,619 dated Mar. 11, 2014, 13 pages.
Non-Final Office Action for U.S. Appl. No. 13/209,190 dated Sep. 21, 2015, 13 pages.
Non-Final Office Action on U.S. Appl. No. 13/209,190 dated Oct. 16, 2013, 10 pages.
Non-Final Office Action on U.S. Appl. No. 13/427,619 dated Mar. 11, 2014, 21 pages.
Non-Final Office Action on U.S. Appl. No. 13/902,169 dated Aug. 25, 2014, 12 pages.
Non-Final Office action on U.S. Appl. No. 13/902,169 dated Aug. 25, 2014, 19 pages.
Non-Final Office Action on U.S. Appl. No. 15/332,335 DTD Sep. 7, 2018.
Notice of Allowance for U.S. Appl. No. 13/209,190, dated Jun. 17, 2016, 7 pages.
Notice of Allowance for U.S. Appl. No. 13/427,619, dated Dec. 1, 2014, 9 pages.
Notice of Allowance on U.S. Appl. No. 15/332,335 DTD Jul. 30, 2019.
Notice of Allowance on U.S. Appl. No. 15/332,335 DTD Oct. 30, 2019.
Oehrlein, et al., "Plasma-polymer Interactions: A review of Progress in Understanding Polymer Resist Mask Durability During Plasma Etching for Nanoscale Fabrication," Journal of Vacuum Science & Technology B 29(1), 010801, 35 pages (2011).
Office Action for U.S. Appl. No. 13/209,190, dated Jun. 10, 2015, 12 pages.
Office Action forU.S. Appl. No. 13/209,190, dated May 1, 2014, 10 pages.
Office Action for U.S. Appl. No. 13/209,190, dated Nov. 24, 2014, 13 pages.
Office Action for U.S. Appl. No. 13/902,169, dated May 18, 2015, 17 pages.
Office Action for U.S. Appl. No. 14/645,162, dated Nov. 18, 2016, 13 pages.
Olynick, et al., "25 nm Mechanically Buttressed High Aspect Ration Zone Plates: Fabrication and Performance," Journal of Vacuum science & Technology B 22(6), pp. 3186-3190 (2004).
Park, et al., "Block Copolymer Lithography: Periodic Arrays of 10-11, Holes in 1 Square Centimeter", Science, 276(6317), pp. 1401-1404 (1997).
Peng, et al., "A Route to Nanoscopic Materials via Sequential INfiltration Synthesis on Block Copolymer Templates," ACS Nano 5(6), pp. 4600-4606 (2011).
Peng, et al., "Nanoscopic Patterned Materials with Tunable Dimensions via Atomic Layer Deposition on Block Copolymers," Advanced Materials 22(45), pp. 5129-5133 (2010).
Perdew, et al., "Generalized Gradient Approximation Made Simple," Physical Review Letters 77(18), pp. 3865-3868 (1996).
Pierrat, et al., "PRIME Process for Deep UV and e-beam Lithography," Microelectronic Engineering 11(1-4), pp. 507-514(1990).
Poirier, et al., "Two-Dimensional Liquid Phase and the px.sqroot.3 Phase of Alkanethiol Self-Assembled Monolayers on Au(111)," Langmuir 10(10), pp. 3383-3386 (1994).
Ras, et al., "Hollow Inorganic Nanospheres and Nanotubes with Tunable Wall Thickness by Atomic Layer Deposition on Self-Assembled Polymeric Templates", Advanced Materials 19(1), pp. 102-106 (2007).
Rio, et al., "Study on Line Edge Roughness for Electron Beam Acceleration Voltages from 50 to 5 kV," Journal of Vacuum Science & Technology B 27(6), pp. 2512-2517 (2009).
Satou, et al., "Study of Bi-layer Silylation Process for 193 nm Lithography," Journal of Photopolymer Science and Technology 12(4), pp. 687-692 (1999).

Shenai-Khatkhate, et al., "Accurate vapor pressure equation for trimethylindium in OMVPE," Journal of Crystal Growth 310(7-9), pp. 2395-2398 (2008).
Somervell, et al., "Study of the Fundamental Contributions to Line Edge Roughness in a 193 nm, Top Surface Imaging Systems," Journal of Vacuum Science & Technology B 18(5), pp. 2551-2559 (2000).
Tanishiro, et al., "UHV transmission electron microscopy on the reconstructed surface of (111) gold: I. General features," Surface Science 111(3), pp. 395-413 (1981).
Thackeray, et al., "Approaches to Deep Ultraviolet Photolithography Utilizing Acid Hardened Resin Photoresist Systems," Journal of Vacuum Science & Technology B 7(6), pp. 1620-1623 (1989).
Tseng, et al., "Enhanced Block Copolymer Lithography Using Sequential Infiltration Synthesis," The Journal of Physical Chemistry C 115(36), p. 17725-17729 (2011).
Tseng, et al., "Enhanced Block Copolymer Lithography Using Sequential Infiltration Synthesis," The Journal of Physical Chemistry C 115, pp. 17725-17729 (2011).
Tseng, et al., "Enhanced Lithographic Imaging Layer Meets Semiconductor Manufacturing Specification a Decade Early," Advanced Materials 24(19), pp. 2608-2613 (2012).
Tseng, et al., "Enhanced Polymeric Lithography Resists via Sequential Infiltration Synthesis," Journal of Materials Chemistry 21(32), pp. 11722-11725 (2011).
Tseng, et al., "Etch Properties of Resists Modified by Sequential Infiltration System," Journal of Vacuum Science & Technology B 29(6), 06FG01, 4 pages (2011).
Tuda, et al., "Profile Evolution During Polysilicon Gate Etching Wth Low-Pressure High-Density C12/HBr/O2 Plasma Chemistries," Journal of Vacuum Science & Technology A 19(3), pp. 711-717 (2011).
U.S. Notice of Allowance on 051583-0533 DTD dated Dec. 1, 2014.
U.S. Office Action For U.S. Appl. No. 13/209,190, dated Apr. 6, 2016, 14 pages.
U.S. Office Action for U.S. Appl. No. 13/902,169, dated Mar. 24, 2016, 16 pages.
U.S. Office Action for U.S. Appl. No. 13/902,169, dated Sep. 18, 2015, 16 pages.
U.S. Office Action on 051583-0501 dated Oct. 16, 2013.
U.S. Office Action on 051583-0501 dated Nov. 24, 2014.
U.S. Office Action on 051583-0501 dated May 1, 2014.
U.S. Office Action on 051583-0533 dated Mar. 11, 2014.
U.S. Office Action on 051583-0533 dated Aug. 13, 2014.
U.S. Office Action on 051583-0588 dated Aug. 25, 2014.
US.. Office Action on U.S. Appl. No. 13/902,169 dated Oct. 11, 2016.
Vertommen, et al., "Integrated Silylation and Dry Development of Resist for sub-0.15 µm Top Surface Imaging Applications," Journal of Photopolymer Science and Technology 11 (4), pp. 597-612 (1998).
Wang, et al., "Nanoscopic Morphologies in Block Copolymer Nanorods as Templates for Atomic-Layer Deposition of Semiconductors," Advanced Materials 21(27), pp. 2763-2766 (2009).
Xiong, et al., "Gate Line Edge Roughness Effects In 50 nm Bulk MOSFET Devices, Metrology," SPIE Proceedings 4689, Metrology, Inspection, and Process Control for Microlithography XVI, pp. 733-741 (2002).
Ye et al., "Statistical Modeling and Simulation of Threshold Variation Under Random Dopant Fluctuations and Line-Edge Roughness," IEEE Transactions on Very Large Scale Integration (VLSI) Systems 19(6), pp. 987-996 (2011).
Zhang, et al., "Indium tin oxide films prepared by radio frequency magnetron sputtering method at a low processing temperature," Thin Solid Films 376(1-2), pp. 255-263 (2000).
Zilko, "Metal Organic Chemical Vapor Deposition: Technology and Equipment," Handbook of Thin Film Deposition Processes and Techniques: Principles, Methods, Equipment and Applications, pp. 151-203(2001).

\* cited by examiner

ORDERED NANOSCALE DOMAINS BY INFILTRATION OF BLOCK COPOLYMERS

CROSS REFERENCE TO RELATED PATENT APPLICATIONS

The present application is a divisional of U.S. patent application Ser. No. 15/332,335, filed Oct. 24, 2016, which is a divisional of U.S. patent application Ser. No. 13/209,190, filed Aug. 12, 2011, now U.S. Pat. No. 9,487,600, which claims priority to U.S. Provisional Patent Application No. 61/374,349, filed Aug. 17, 2010, the contents of all of which are incorporated herein by reference in their entireties.

STATEMENT OF GOVERNMENT INTEREST

This invention was made with government support under Contract No. DE-AC02-06CH11357 awarded by the United States Department of Energy to UChicago Argonne, LLC, operator of Argonne National Laboratory. The government has certain rights in the invention.

FIELD OF THE INVENTION

This invention relates to a method of preparing ordered nanoscale domains. More specifically, this invention relates to a method of preparing inorganic ordered nanoscale domains by the infiltration of block copolymers with a plurality of precursors.

BACKGROUND OF THE INVENTION

This section is intended to provide a background or context to the invention that is, inter alia, recited in the claims. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

Patterned nanoscale inorganic materials with controllable characteristic feature size, symmetry, and properties are of considerable interest in a wide range of fields. However, as feature dimensions shrink below 50 nm, conventional top-down lithographic patterning methods typically suffer from slow processing speeds and high costs. To date, wide-scale implementation of applications for nanomaterials has been hindered by limitations associated with production. Molecular-level control in the synthesis of nanomaterials with precisely tunable properties is highly desired for mass production of nanoscale devices. Equally important in production is low-cost fabrication of periodic nanoscale features over large areas. Using conventional methods, these twin goals are generally at odds with each other.

An alternative, and less expensive approach, is to employ a process analogous to the biomineralization process and use self-assembled organic structures as growth-directing agents to guide the synthesis of inorganic materials into the desired morphology. For example, block copolymers (BCPs), which have two or more chemically dissimilar homopolymers joined together through covalent bonds, can self-assemble into ordered periodic nanostructure configurations (e.g. spheres, cylinders, lamellae and bicontinuous structures) under appropriate conditions due to microphase separation. Useful devices can be fabricated from ordered block copolymer structures by tuning the material properties of the two polymer domains. Although the properties of the component polymers can be adjusted prior to forming the ordered domains using organic synthesis, this may affect the phase separation of the polymers and prevent formation of the desired nanostructure.

BCPs have offered a relatively easy, inexpensive, and versatile platform for templating inorganic materials growth. A variety of inorganic materials have been self-assembled on BCPs for localized selective growth of such materials in the desired domains, which can act as nanoreactors to physically confine the growth, generally through hydrophobic forces. However, using conventional techniques, the dimensions of the templated materials are determined by the physical size of the original domains in the BCP scaffold, limiting the flexibility of these methods. Moreover, the loss of selectivity from uncontrolled homogeneous reactions cannot be fully prescribed, especially for reactions involving hydrolytic unstable precursors such as titania and other technologically important metal oxides. More importantly, the localized material growth in the targeted domains is not controllable on the molecular level, which is vital for assuring large-scale uniformity in mass production of organized nanoscale materials with precisely controlled material properties.

SUMMARY

The present invention provides processes for preparing nanostructures and offers a high degree of molecular-level control while maintaining large-scale uniformity and tunable modularity of the nanostructures. Molecular-level management of reactions is achieved by a self-limited interaction of metal precursors with a self-assembled block copolymer (BCP) scaffold. Using molecular recognition and organized assembly characteristics and BCPs, several of the difficulties associated with various conventional nanofabrication processes can be overcome. In some embodiments, sequential infiltration synthesis (SIS), a method related to atomic layer deposition (ALD) is used for preparing inorganic features with patterned nanostructures on the BCP scaffolds.

The present approach utilizes the polymer chains in well-defined BCP domains as the molecular scaffold for templating inorganic materials growth through a highly controllable molecular assembly process. Through the design of the BCP scaffold and selection of the synthesis parameters, patterned designer materials with controlled size, spacing, symmetry, and composition can be synthesized. Moreover, the processes can yield desirable nanoscale structures at low cost. Potential applications for these methods and system extend to virtually all technologies in which periodic nanomaterial structures are desirable, including photovoltaics, sensors, membranes, photonic crystals, dielectric materials, and electronics.

In one BCP system, polystyrene-block-poly (methyl methacrylate) (PS-b-PMMA) is presented as an illustrative example. However, the invention is not so limited and the present methodology is readily extended via the virtually limitless variety of chemistries available both in BCPs and in ALD or SIS.

In an embodiment, a method of preparing a plurality of tunable inorganic patterned nanometer-scale features by infiltration of a block copolymer scaffold comprises providing a block copolymer scaffold of at least a first polymer and a second polymer and includes a plurality of self-assembled periodic polymer nanostructures. The method further comprises selecting a first metal precursor that is configured to react with the first polymer but is substantially non-reactive with the second polymer. A second co-reactant precursor configured to react with the first precursor is also selected. At least one cycle on the block copolymer scaffold is performed. A cycle comprises exposing the block copolymer scaffold to the first metal precursor to react the first metal precursor with the first polymer and exposing the block copolymer scaffold to the second co-reactant precursor to react with the first metal precursor to form an inorganic material on (within) the first polymer. This embodiment can be executed in either two-dimensional (single-layer) or three-dimensional (multi-layer) structures. In some cases an initial cycle can be used to deposit an initial layer that subsequently serves as a seed for cycles of a different chemistry.

In another embodiment, a method of preparing an inorganic ordered nanoscale domain through a self-limited reaction within a block copolymer comprises providing a block copolymer with a plurality of ordered polymer nanoscale domains, which are characterized by a reactive functional group. The method further comprises selectively binding a first precursor to the reactive functional group in a self-limited reaction. Next, a second precursor is reacted with the bound first precursor to form an inorganic feature that is localized on the plurality of nanoscale domains within the block copolymer. The block copolymer may then optionally be removed in order to obtain a plurality of the inorganic features, substantially free of the copolymer, that have a structure defined by the configuration of the plurality of nanoscale domains within the block copolymer prior to its removal. In the described embodiment, the block copolymer is substantially free of the reactive functional group outside of the ordered polymer nanoscale domains. This embodiment can be executed in either two-dimensional (single-layer) or three-dimensional (multi-layer) structures. In some cases an initial cycle can be used to deposit an initial layer that subsequently serves as a seed for cycles of a different chemistry.

In yet another embodiment, a nanocomposite organic/inorganic material comprises a block copolymer that includes a first polymer and a second polymer covalently bonded to the first polymer. The first polymer defines a plurality of self-assembled ordered microdomains disposed within the second polymer. The first polymer includes at least one functional group absent from the second polymer. The nanocomposite material further includes an inorganic material that is substantially embedded with each of the plurality of ordered microdomains. The inorganic features comprise at least one metal selectively bound to at least one functional group. The at least one metal does not bind to the second polymer. This embodiment can be executed in either two-dimensional (single-layer) or three-dimensional (multi-layer) structures. In some cases an initial cycle can be used to deposit an initial layer that subsequently serves as a seed for cycles of a different chemistry.

These and other advantages and features of the invention, together with the organization and manner of operation thereof, will become apparent from the following detailed description when taken in conjunction with the accompanying drawings, wherein like elements have like numerals throughout the several drawings described below.

BRIEF DESCRIPTION OF THE DRAWINGS

FIG. 2f depicts a mixture of $Al_2O_3$ nano-posts and nanocylinders obtained from polymer domains with different orientations.

DETAILED DESCRIPTION OF EMBODIMENTS

Figures 1A, 1B, 1C:
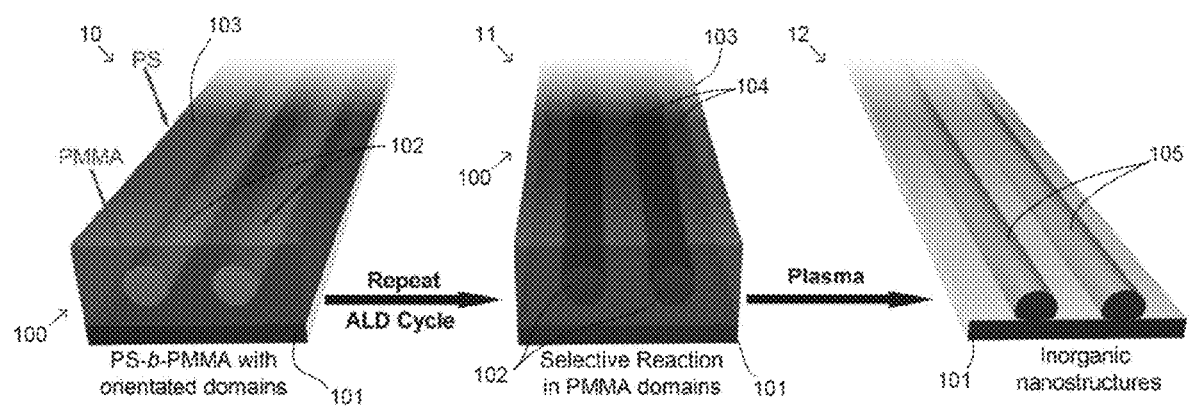
FIGS. 1a-1c represent a schematic depiction for templated synthesis of nanoscopic inorganic materials on a single-layer PS-b-PMMA substrate by SIS.

The present invention provides molecular-level control for preparing inorganic patterned nanostructures of a broad variety of materials with tunable characteristic feature sizes and shapes by utilizing the capabilities of block copolymer self-assembly and the selective interaction of one or more metal precursors with particular polymer units of the block copolymer. The resulting materials have a number of potential uses, including photovoltaic devices, structural supports for a separation membrane in a battery, a fluid filtration membrane, filtering and/or guiding selected wavelengths of light, as active channel material in a transistor, as an array emitter or a field emitter, a three-dimensional electrical contact, and a catalyst. In photovoltaic devices, nanostructures comprised of light absorbers, charge separation materials, and/or charge transport materials can outperform analogous devices without nanostructures—this is especially true in systems where bound excitons are formed such as in organic and hybrid organic/inorganic photovoltaics. The uniformity and tenability of spacing between nanostructures lends itself to separation and nanofiltration applications. Photonic crystals with uniformly spaced nanostructures are effective at manipulating and modulating light.

In some embodiments, the method uses sequential infiltration synthesis (SIS), SIS is related to atomic layer deposition (ALD). In general, the SIS process involves exposing the patterned organic material layer to various gas phase precursors to synthesize inorganic features. SIS coats the surface of the organic material but also infiltrates into the bulk organic material as well by adjusting the gas phase exposure pressure and timing. The gas phase precursors are available for selection for SIS modification which are capable of forming inorganic components within a variety of organic materials. Examples of inorganic features prepared by SIS include $Al_2O_3$, $TiO_2$, ZnO, $SiO_2$, and W. The infiltration of the inorganic material may be confirmed by monitoring mass intake by quartz crystal microbalance or by detecting diffusion using cross-sectional analysis with EDX or other techniques.

In some embodiments, the SIS method may include relatively long periods of gas phase exposure to precursors. For example, the SIS method may include a relatively long period of gas phase exposure to precursor A followed by a long period of exposure to precursor B (with a purging step in-between). In another embodiment, the method may include a series of short pulses of A followed by another series of short pulses of B (with a purging step in-between). In some embodiments, a series of short pulses may be combined with long periods of gas phase exposure to a precursor. In some embodiments, the total time of exposure to a precursor for a SIS cycle may be 5 to 25 times higher than the typical time for an ALD cycle. In some embodiments, the total time of exposure to a precursor for a SIS cycle may be 10 times higher than the typical time for an ALD cycle. In some embodiments, the SIS method may include use of high pressure to facilitate infiltration of the inorganic material.

Various embodiments of the present invention utilize sequential infiltration synthesis (SIS), which is related to atomic layer deposition (ALD) to form patterned inorganic features in a block copolymer scaffold. In an embodiment, a block copolymer scaffold is exposed alternately to two reactive gases. The first reactive gas may be a metal precursor that is selectively reactive with a functional group present in one of the polymer units but absent from at least one of the other polymer units in the block copolymer. The metal precursor selectively binds (either covalently or non-covalently) to the functional group but is substantially non-reactive with one or more other polymers. Substantially non-reactive refers to no greater than 10% polymer/precursor reaction as compared with the reaction between the target polymer and precursor. The metal precursor is substantially non-reactive when the precursor does not bind to the polymer under a SIS reaction. The second reactive gas may be a co-reactant—for example, serving as a second precursor in a cycle—that is selectively reactive with the first precursor that is bound to the polymer unit. By way of example, the first reactive gas may be a ligated metal such as trimethyl aluminum (TMA) and the second reactive gas may be water. In some embodiments, a third precursor may be used.

Block copolymers are molecules composed of two or more polymers connected with covalent bonds. For example, polystyrene-block-poly(methyl methacrylate) (PS-b-PMMA) is composed of polystyrene (PS) and poly(methyl methacrylate) (PMMA) covalently linked. By varying the preparation conditions of the block copolymer, these blocks will phase-separate and self organize into structures with ordered nanoscale domains in various configurations such as spheres or lamella. The characteristic shape and dimensions of these domains can be tuned via polymeric design. In some embodiments, the block copolymer includes a plurality of self-assembled periodic polymer nanostructures. The nanostructures such as cylinders assemble on their own into a repeated pattern, such as by phase separation, which can, in some cases, be directed or manipulated with external parameters such as temperature, solvent vapors, electric fields, mechanical forces, magnetic fields, flow, or surface topography.

In general, on a scaffold surface with the correct chemical termination, the SIS process results in the growth of an inorganic features associated with the SIS precursors used. The inorganic features is an inorganic layer that may be between 0.2 nm to 500 nm in height. For example, an aluminum oxide ($Al_2O_3$) features may be formed on the scaffold surface using a TMA precursor and a water co-reactant precursor. However, where the appropriate chemical termination is absent from the scaffold surface the SIS of the precursors will be inhibited. By selecting the precursors to selectively react with only one of the block copolymer units, the SIS process will result in growth within that polymer component only. Thus, SIS using TMA and water precursors on a PS-b-PMMA scaffold results in growth of inorganic $Al_2O_3$ features almost exclusively within the PMMA component, to the exclusion of the PS component. In some embodiments, less than 10% of $Al_2O_3$ growth may be in the PS. The ALD precursors infiltrate molecular-scale voids in the block copolymer scaffold and attach (covalently or non-covalently) to the polymer chains to form an inorganic-organic hybrid composite material. For example, TMA will react with the oxygen species in the PMMA component but not with the PS, which is comprised solely of carbon and hydrogen. An inorganic feature, in this case an $Al_2O_3$ feature, substantially assumes the same ordered nanostructure/spacing as the block copolymer, although the width of individual domains can be further tuned using the number of SIS cycles. The composite coated polymer scaffold can be left intact, or the sample can be oxidized to remove the organic material, leaving only the inorganic SIS material but preserving the initial structure provided by the block copolymer in the inorganic component.

In light of the broad range of selective chemistries between various metal precursors suitable for ALD/SIS and polymer units as well as the enormous library of block copolymers and ALD-related processes, patterned functional materials could be synthesized onto a broad range of scaffolds. The process may be generalized to designing the desired block copolymers in terms of materials and microdomain configuration (e.g., shape and dimensions) and selecting corresponding SIS precursors reactively compatible with the appropriate polymer units and characterized by the desired final material properties (e.g., electronic and/or photo response). The process may used in forming various inorganic materials, including a metal, metal oxide, a metal nitride, a metal sulfide or other metal chalcogenide, a metal carbide, or a metal phosphide. In various embodiments, a transparent conductive metal oxide such indium tin oxide (ITO) may be formed using ALD precursors known in the art.

For example, following the present approach, various inorganic features have been selectively deposited within block copolymers, including the formation of ZnO, $TiO_2$, and W features. These materials grow exclusively on the PMMA unit of the PS-b-PMMA via selective reaction with the carbonyl chemistry of the PMMA. However, the precursors associated with the features are non-reactive with PS, which has no carbonyl groups. For each material, the inorganic material assumes the self-assembled, periodic nanostructure of the PMMA within the copolymer scaffold. Thus, an inorganic material is selectively nanopatterned and an organic/inorganic hybrid composite material is formed.

Although carbonyl functional groups are described as one example of a polymer component or reactive functional groups that may be utilized for selective inorganic material growth, a variety of different polymer units are available to interact with various metal precursors through various interactions, including metal-ligand coordination, covalent bonding, and other interactions. For example, the pyridine groups in polyvinylpyridine, a common block for BCPs, could be used to selectively bind various metal compounds including $Al(CH_3)_3$, $AlCl_3$, $ZnCl_2$, $CdCl_2$, etc., which may be used as precursors in ALD-related processes. Additionally, hydroxyl groups provided by polyacrylic acid, another common block for BCPs, could react with various metal precursors, including $Al(CH_3)_3$, $TiCl_4$, $Zn(C_2H_5)_2$, etc. to form covalent bonds.

Two components are significant in driving the present processes to obtain particular material characteristics. The first component is the selective and self-limited reaction of a metal precursor such as $TiCl_4$, $SnCl_4$, $AlCl_3$, $Al(CH_3)_3$, etc., which are Lewis acids in this example, with strategically selected functional moieties in the BCP such as the carbonyl groups in PMMA microdomains. Once bound to the polymer, the grafted metal-ligands serve as nucleation sites for the second component, which is the inorganic material synthesis by SIS. Within each of these components, the reactions are controllable on the molecular level and the characteristic self-limited heterogeneous reactions provide macroscopic uniformity in principle.

A broad range of organized nanomaterials with tunable dimensions can be synthesized from a BCP scaffold such as PMMA and an even more expansive range is available in the context of other BCP chemistries. To demonstrate this approach with a particular set of materials, organized $Al_2O_3$ and $TiO_2$ nanocylinders with controllable dimensions were synthesized. Starting with a monolayer of —Al—OH seeds generated in the PMMA domain via $Al_2O_3$ SIS.

FIG. 1 depicts a technique for patterning a plurality of inorganic nanoscale features onto a scaffold by performing SIS with a self-assembled PS-b-PMMA block copolymer features template. The term "self-assembled" refers to both spontaneous organization to the BCP into nanoscale domains such as PMMA cylinder within a PS matrix or directed or biased self assembly such as by the use of an electric field or a temperature/pressure gradient. At 10 a PS-b-PMMA scaffold 100 is provided on a process scaffold 101, which may be a Si wafer, and loaded into the ALD reactor. The PS-b-PMMA scaffold 100 comprises a plurality of orientated PMMA microdomains 102 having one or more defined configurations, cylinders in the depicted embodiment. The plurality of orientated PMMA microdomains 102 are disposed within a matrix of PS 103.

Figure 6A:
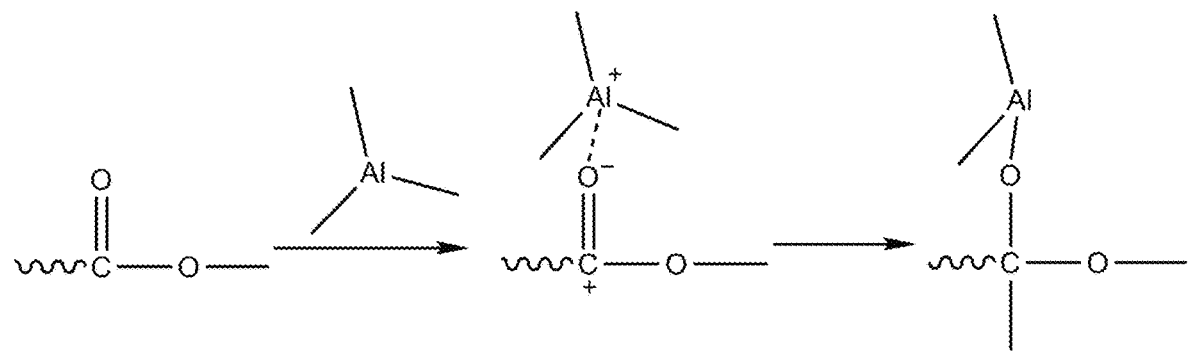
FIG. 6a-6b schematically depict the bonding interaction of TMA and $TiCl_4$, respectively, with a carbonyl group disposed within a block copolymer scaffold.

At 11 the PS-b-PMMA scaffold 100 is exposed to a vapor of a metal precursor, which diffuses into the BCP features and selectively reacts specifically with carbonyl groups in the PMMA domains as depicted in FIG. 6A. The non-coordinated excess metal precursor is then removed from the domain by a purge step such as with high purity $N_2$ to prevent non-self-limited, homogeneous reactions. The PS-b-PMMA scaffold 100 is then exposed to a co-reactant precursor such as water, which reacts with the coordinate metal precursor. The first monolayer of a coordinated metal precursor provides reactive sites for the subsequent SIS process, which selectively grows an inorganic material 104 within the active PMMA microdomains 102. As the SIS process operates in a self-limited heterogeneous surface reaction mode, the growth of materials in the PMMA microdomain 102 continues in bottom-up assembly fashion with molecular precision. At 12, the polymer template 100 may be removed by thermal annealing or plasma treatment or other process known in the art. The result is a patterned inorganic structure 105 that mimics the configuration of the original self-assembled PMMA microdomains 102.

Because the assembly process of the present technique uses units on the polymer chains as the molecular template, the final domain size of the deposited inorganic material is mainly determined by a combination of the number of available reactive sites in the domain and the amount of material being assembled into the domain by SIS cycling, an SIS cycle comprising exposure of the scaffold to the metal precursor and the following co-reactant exposure. This combination of attributes offers significant flexibility in tuning the final feature size when compared with conventional methods. For example, the process is capable of fabricating features considerably narrower than the characteristic dimension of the scaffold template. Additionally, the separated heterogeneous surface reactions in this process greatly decrease the likelihood of uncontrollable overgrowth in undesired microdomains.

With reference to FIGS. 2a-2e, a series of SEM images show patterned $Al_2O_3$ nanocylinders resulting from 1 (FIG. 2a), 2 (FIG. 2b), 3 (FIG. 2c), 6 (FIGS. 2d and 2f), and 10 (FIG. 2e) SIS cycles of $Al_2O_3$ with a PS-b-PMMA features over a silicon scaffold. The figures show the nanocylinders after the self-organized PS-b-PMMA BCP scaffold thin features were removed by $O_2$ plasma treatment or by heating in air at 500° C. for 6 hours. The $O_2$ plasma etching was performed at 50 W for 1 minute in a March CS-1701 plasma etcher.

In some embodiments, sequential infiltration synthesis (SIS) can be utilized to provide the described stepwise growth. In certain embodiments, finely tuned processing conditions, complex composites and inorganic nanomaterials with tunable features of hierarchical scales can be synthesized for applications ranging from solar cells to lithium batteries to catalysis. In-situ diffusion and reaction studies using a quartz crystal microbalance (QCM) show that even though SIS is a self-limited stepwise growth process, the SIS process depends strongly on complex coupled diffusion and reaction processes, which differentiates it from traditional atomic layer deposition. For example, in-situ QCM data shows that for polystyrene-block-poly (methyl methacrylate) (PS-b-PMMA) block copolymer (BCP) features, the reactants diffuse to the reactive site in PMMA through PS domains. The PS domains, being unreactive to the precursors act as a highway for delivering those reactants and remain unobstructed throughout the SIS process. Because the reaction between metal precursor and PMMA influences the mobility of molecular chains of PMMA, the diffusion of metal precursors strongly deviates from the classic diffusion model derived from Fick's Law. In other words, the presence of the PS matrix allows for an alternative pathway for the inorganic material to infiltrate the BCP even after the diffusion pathways are blocked by repeated cycles.

In one embodiment, by tuning the strength of the reaction between metal precursors and soft matter (e.g. polymers), the interface between the SIS-synthesized materials and soft matter can be precisely adjusted, as well as the final structure of the composites and templated inorganic materials. For example, poly (4-vinyl pyridine) presents strong coordination reaction with $TiCl_4$ and $Al(CH_3)_3$, which prevents further material diffusion into the polymer and results in hollow tubes and spheres. For PMMA scaffolds, the reaction between metal precursors and soft matter is not strong enough to block the diffusion of materials into the matrix of PMMA nanodomains, therefore, solid nanorods, nanowires, or nanoposts with precisely-controlled size can be generated.

EXAMPLES

Polystyrene-block-poly(methyl methacrylate) (PS-b-PMMA, Mw=50,500/20,900) (Polymer Source, Inc.) was purified through Soxhlet extraction to remove excess PS homopolymer. BCP solutions were prepared in toluene (Fisher, 99.5%) with a concentration of 13 mg/mL. The $PS_{485}$-b-$PMMA_{201}$ block copolymer scaffold features were prepared by spin coating from a toluene solution onto cleaned silicon scaffolds with native $SiO_2$. After deposition, PS-b-PMMA features were annealed at 250° C. for two hours in a tube furnace under a flowing Ar atmosphere, then cooled to room temperature to obtain self-assembled patterns. The in-plane PMMA cylinders were 30±3 nm in diameter, and the center-to-center lateral distance was 60±5 nm. These dimensions can be varied by adjusting the molecular weight of the constituent polymer blocks.

The $Al_2O_3$SIS process was performed using the SIS timing sequence: 60/300/60/300 seconds, where the first times represent first metal precursor trimethyl aluminum ($Al(CH_3)_3$ TMA 96%) exposure, inert purge, second co-reactant precursor (water) exposure, and inert purge. Ultra-high purity $N_2$ (99.999%) was used as the purge gas and carrier gas with further purification by an inert gas filter (Aeronex Gatekeeper) before entering the reactor. All precursors were introduced into the ALD reactor at room temperature vapor. In order to remove moisture and achieve thermal equilibrium, the scaffolds were subjected to a 300 sccm $N_2$ flow at 1 Torr for at least 30 minutes and then evacuated to less than 20 mTorr before commencing SIS.

Figures 2A, 2B, 2C, 2D, 2E, 2F, 2G, 2H:
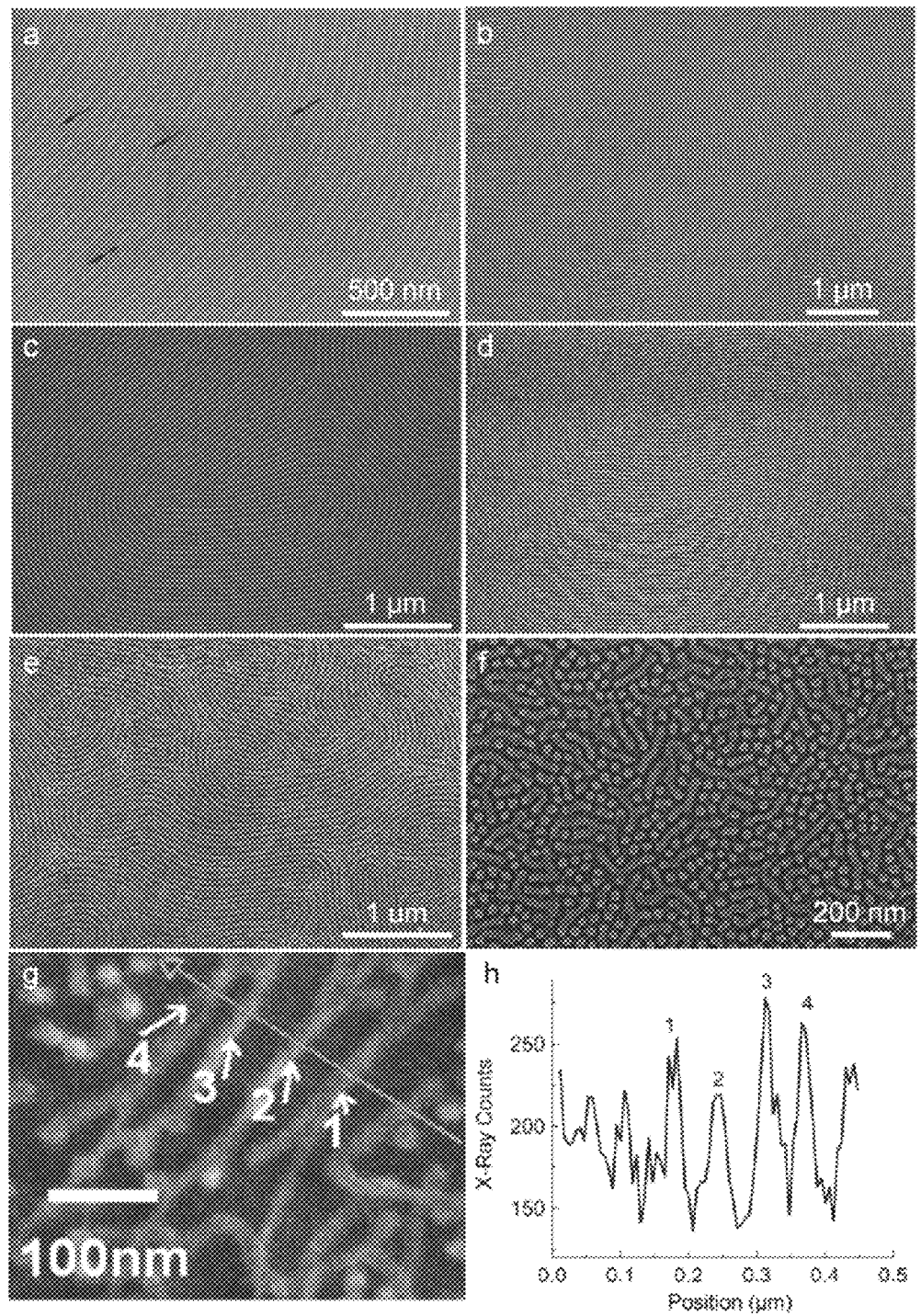
FIGS. 2a-2f show field emission scanning electron microscope (FESEM) images of $Al_2O_3$ patterns formed on a PS-b-PMMA scaffold disposed on a silicon (Si) wafer formed by various iterations of SIS cycles of $Al_2O_3$ with an exposure/purge timing sequence (60/300/60/300 seconds) followed by an $O_2$ plasma treatment to remove the PS-b-PMMA scaffold, with FIG. 2a showing 1 SIS cycle, FIG. 2b showing 2 SIS cycles, FIG. 2c showing 3 SIS cycles, FIGS. 2d and 2f showing 6 SIS cycles, and FIG. 2e showing 10 SIS cycles.
FIG. 2g illustrates a concentration of Al disposed along the plurality of nanocylinders.
FIG. 2h is a plot of the concentration of Al obtained from energy dispersive X-ray spectroscopy (EDX) taken along the path depicted in FIG. 2g.

As depicted in FIGS. 2a-2e, each of the $Al_2O_3$ stripe patterns resemble the parallel-oriented cylindrical microdomains of PMMA that were present in the original PS-b-PMMA scaffold thin features. FIGS. 2a-2f show field emission scanning electron microscope (FESEM) images of $Al_2O_3$ patterns formed on a PS-b-PMMA scaffold disposed on a silicon (Si) wafer formed by various iterations of SIS cycles of $Al_2O_3$ with an exposure/purge timing sequence (60/300/60/300 seconds) followed by an $O_2$ plasma treatment to remove the PS-b-PMMA scaffold, with FIG. 2a showing 1 SIS cycle, FIG. 2b showing 2 SIS cycles, FIG. 2c showing 3 SIS cycles, FIGS. 2d and 2f showing 6 SIS cycles, and FIG. 2e showing 10 SIS cycles; FIG. 2f depicts a mixture of $Al_2O_3$ nano-posts and nanocylinders obtained from polymer domains with different orientations Additionally, the spatially localized presence of Al was verified by energy dispersive X-ray spectroscopy (EDX) as illustrated in the plot of FIGS. 2g and 2h, which illustrate a concentration of Al disposed along the plurality of nanocylinders. Some of the PMMA features are oriented in the plane of the field and other are standing on one end and appear to be chains and dots in FIG. 2(f).

Contraction of the polymer and aggregation of the $Al_2O_3$ nuclei during the $O_2$ plasma etching process further explain the formation of $Al_2O_3$ cylinders. The diameter of the $Al_2O_3$ cylinders resulting from one TMA/$H_2O$ cycle is 8.48±1.54 nm, which is much smaller than the approximately 30 nm-wide PMMA domains in the BCP features but also much bigger than expected in view of the $Al_2O_3$ ALD growth rate on a planar surface (1.2 Å/cycle). According to the self-limiting behavior of reaction between TMA and carbonyl groups, the maximum number of TMA molecules coordinating to each PMMA domain is determined by the number of carbonyl groups, which is about 200 per PMMA chain in this case. Assuming all 200 carbonyl units are coordinated to TMA, the cylinder diameter resulting from the first TMA/$H_2O$ SIS cycle would be about 11.5 nm, which is slightly higher than the experimentally observed value. The actual smaller size of the $Al_2O_3$ cylinders is attributable to a reduction in the number of coordinated TMA molecules by steric effects of the ligands in grafted TMA and the polymer scaffold and folding of polymer chains. These mechanisms are further supported by the broken points (as indicated by the arrows in FIG. 2a) along the $Al_2O_3$ cylinders generated from a single TMA/$H_2O$ cycle. Significantly, the slightly smaller $Al_2O_3$ feature size relative to the theoretical value is indicative of a reaction templated by the carbonyl groups on the polymer chain; and the coordination process of TMA onto the carbonyl groups is indeed self-limited. These characteristics provide the desired molecular-level control of the present processes.

With the Al—OH nucleation sites formed in the first cycle through the coordination reaction between TMA and the carbonyl groups and the following hydrolysis reaction with $H_2O$, traditional $Al_2O_3$ ALD chemistry could be performed to incorporate more Al—O ligands into the domain in a self-limited layer-by-layer fashion. With increasing $Al_2O_3$ cycles, the diameter of the $Al_2O_3$ cylinders increases as deduced from FIGS. 2a-2e. After 10 cycles, the $Al_2O_3$ cylinder diameter increases to 30.8±2.7 nm, which is comparable to the original PMMA domain size. The $Al_2O_3$ cylinders become continuous for samples with more than 1 TMA/$H_2O$ cycle as evidenced by the absence of visible breaks in the cylinders depicted in FIGS. 2b-2e.

Figure 3:
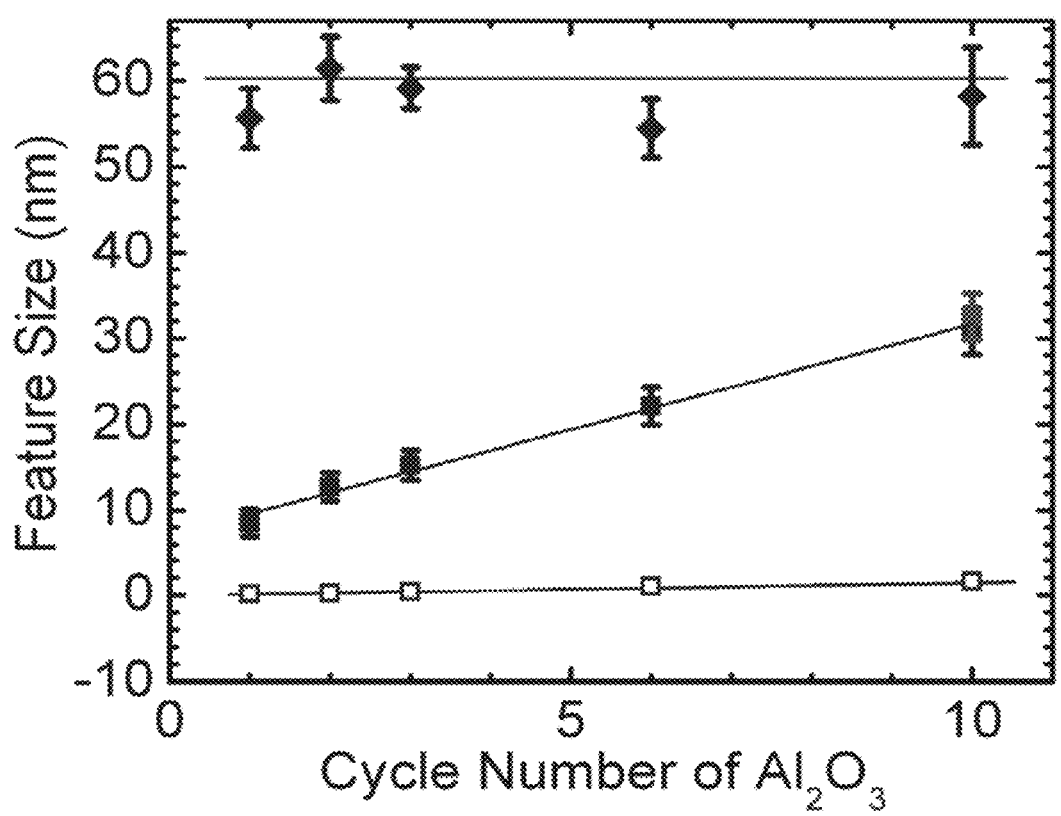
FIG. 3 is a plot of cylinder diameter (depicted by black squares ■) and center-to-center cylinder spacing (depicted by black diamonds ♦) with increasing $Al_2O_3$ SIS cycles and the corresponding $Al_2O_3$ features thickness (depicted by white squares □) on a separate Si wafer.

With reference to FIG. 3, the cylinder diameters as well as the center-to-center spacings measured from the SEM images (FIGS. 2a-2e) are plotted against the number of cycles. The mean center-to-center value remains nearly constant, at about 60 nm, regardless of the number of cycles performed. This value is consistent with the center-to-center spacing between PMMA domains in the initial BCP thin features template, 60 nm±5 nm.

The linear dependence of the $Al_2O_3$ cylinder size on the number of cycles depicted in FIG. 3 highlights the capability of ALD to tune the inorganic feature size without changing the dimensions of the BCP template. This eliminates the need to prepare BCPs with different domain sizes to control the size of the nanostructure, therefore providing substantial flexibility and simplifying the process. The increase of $Al_2O_3$ cylinder diameter results directly from the addition of material into the PMMA domains with each cycle. Further, as seen from FIG. 3, the $Al_2O_3$ cylinder diameter at 10 cycles using 5× longer precursor exposure times (timing: 300/300/300/300 seconds) than the above described example (timing: 60/300/60/300) is nearly the same as the cylinder diameter obtained using the shorter precursor exposure times. This further demonstrates that $Al_2O_3$ in the PMMA domains is self limited. Lengthening the exposure time in the cycle from 60 s to 300 s did not have an appreciable impact on the feature size, i.e. the amount of inorganic layer formed. This also suggests that a reaction exposure of 60 seconds is near the saturation point of the growth; and 300 seconds of purge time is sufficient to prevent homogenous reactions.

The slope of the line for cylinder diameter in FIG. 3 shows a growth rate of about 2 nm/cycle, which is 16× greater than the $Al_2O_3$ ALD growth rate of 1.2 Å/cycle on planar surfaces determined by ellipsometry from the Si witness samples (lower trace in FIG. 3), such as indicated by the open squares on FIG. 3. The higher growth rate in the polymer may be ascribed to the higher density of accessible reactive sites on the permeable three dimensional PMMA domains with respect to the solid, planar Si surface. On the other hand, the growth rate of $Al_2O_3$ cylinder diameters is smaller than the theoretical value (about 10 nm/cycle) obtained when assuming all Al—OH sites in the polymer matrix are accessible to the following process. This indicates that steric hindrance from Al—OH and polymer ligands limits the number of accessible Al—OH sites. With an increasing number of cycles, the growth of Al—O matrix from different Al—OH seeds will start to coalesce to form a dense and impermeable Al—O network. The growth rate of $Al_2O_3$ in the microdomain will then substantially match the growth rate on a solid Si wafer.

In addition to the flexibility in material deposition, there is also flexibility regarding the morphology or configuration of the BCP template and, therefore, the ultimate configuration of the inorganic nanostructures. For instance, when the PMMA domains are oriented normal to the scaffold, $Al_2O_3$ nanoposts may be fabricated. FIG. 2f shows a plurality of nanoposts formed with a diameter of 22.6±2.8 nm, similar to the in-plane cylinder diameters of 22±2.2 nm observed elsewhere on the same sample. As such, the present processes could be extended to synthesize nanomaterials with any of the morphologies accessible to BCPs, even into three-dimensional matrices.

Figure 6B:
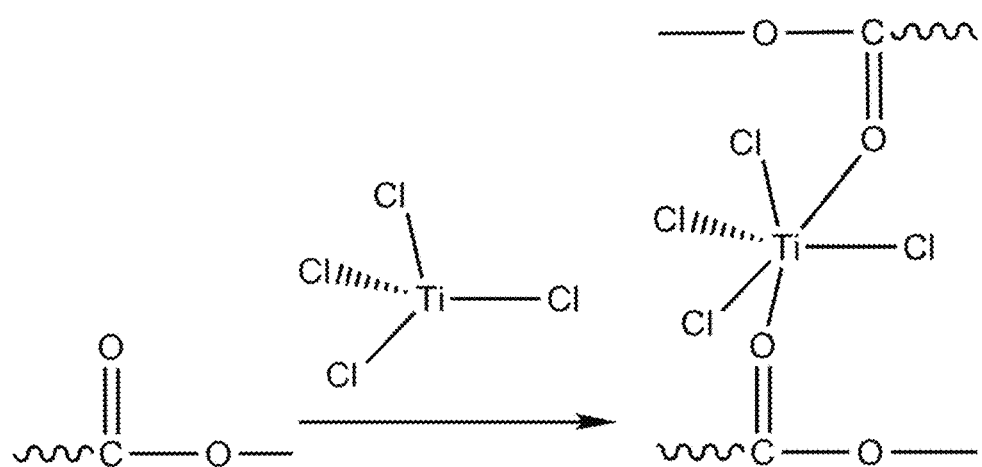

In an embodiment, patterned $TiO_2$ cylinders were prepared using $TiO_2$ SIS at 135° C. onto self-assembled PS-b-PMMA BCP thin features. In the first SIS cycle, titanium tetrachloride ($TiCl_4$, 99.9%) coordinates to the carbonyl groups as illustrated in FIG. 6b, and then $H_2O$ exposure, hydrolyzes the $TiCl_4$ to form Ti—OH which serves as the reactive site for subsequent $TiCl_4/H_2O$ SIS cycles.

Figures 4A, 4B, 4C, 4D:
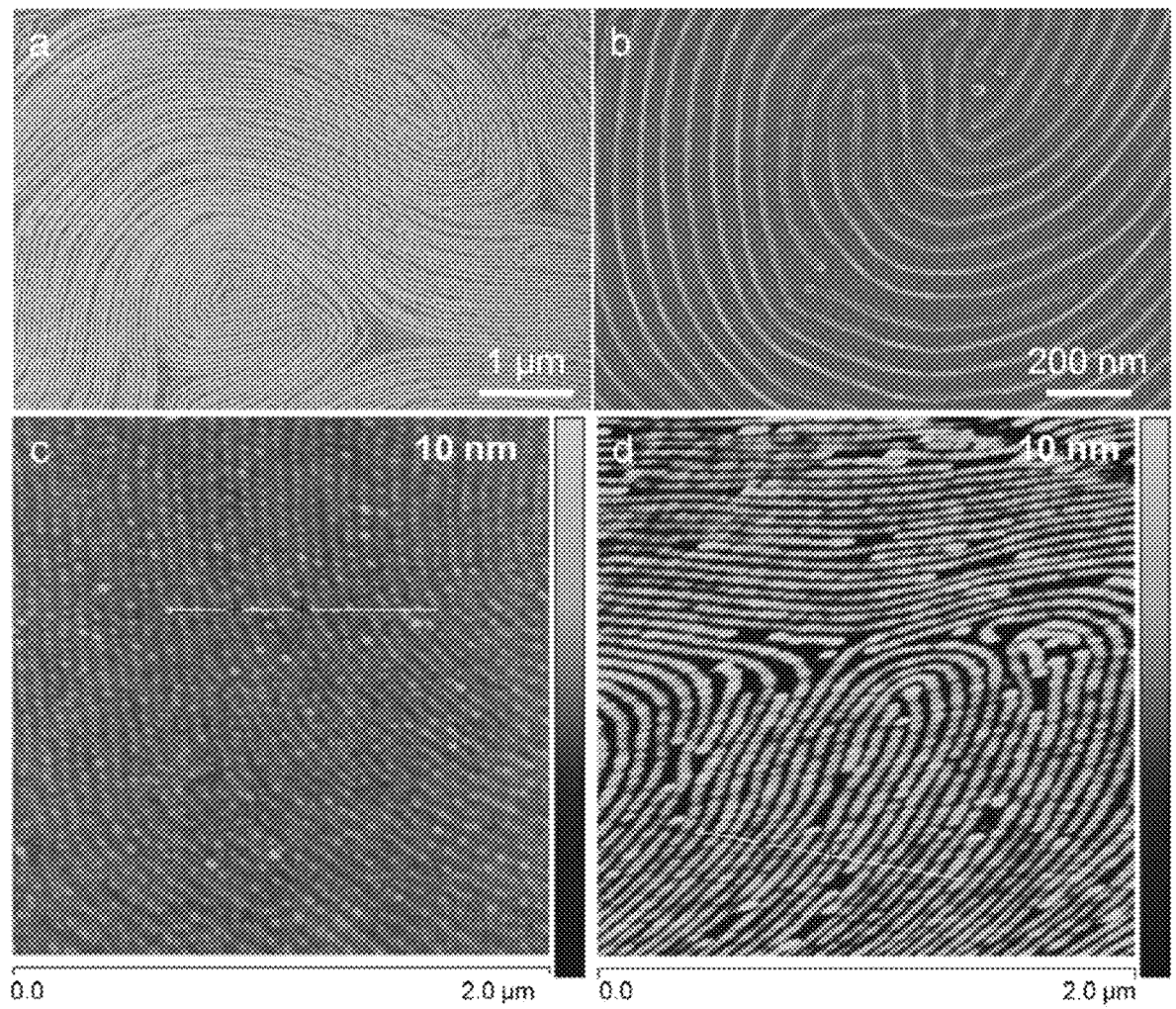
FIGS. 4a and 4b are FESEM images of a pattern of $TiO_2$ cylinders on a Si wafer, formed by 5 and 10 cycles, respectively, of $TiO_2$ SIS.
FIG. 4c is an atomic force microscopy (AFM) height image of the pattern resulting from 5 cycles of ZnO SIS on a PS-b-PMMA scaffold.
FIG. 4d is an AFM height image resulting from 1 cycle of $Al_2O_3$ ALD followed by 3 cycles of ZnO SIS.

Organized patterns of $TiO_2$ cylinders generated with 5 and 10 cycles of $TiO_2$ SIS were visible under SEM as shown by FIGS. 4a and 4b, respectively. Further AFM measurements confirmed the clear patterns of $TiO_2$ cylinders resulting from multiple SIS cycles. X-ray photoelectron spectroscopy (XPS) measurements also confirmed the presence of Ti on the sample surface. As shown in FIGS. 4a and 4b, the domains in light contrast are the $TiO_2$ cylinders with diameters of 13.3±1.4 nm and 16.9±1.9 nm after 5 and 10 $TiO_2$ SIS cycles, respectively. The $TiO_2$ cylinders are smaller than the domain size of the PMMA (about 30 nm) and again indicate that the growth of the $TiO_2$ is guided by the molecular template on the polymer chain. The center-to-center distances of the $TiO_2$ cylinders are nearly identical for these two samples at 55.6±6.6 nm and 59.3±3.2 nm, respectively. These dimensions once again match the corresponding spacing between the PMMA domains. These results confirm that the $TiO_2$ preserves the original pattern that was present in the PS-b-PMMA thin features template.

In another embodiment, nanoscale ZnO patterns was prepared using SIS. An SIS of ZnO (DEZ, >95% Strem and $H_2O$ at 85° C. and 135° C. with the timing sequence: 300/300/300/300 seconds) was performed. If moisture is present in the PMMA domains, ZnO should form via the hydrolysis reaction between DEZ and $H_2O$. However, inorganic features were not observed by SEM after 5 ZnO SIS cycles followed by $O_2$ plasma treatment. The AFM height image shown in FIG. 5c indicates a subtle pattern, suggesting a small amount of largely non-selective growth induced by the weak interaction between DEZ and the carbonyl groups in the PMMA domains. This result indicates that a self limited coordination reaction between the metal precursor and the carbonyl groups on the polymer chains is necessary for seeding the subsequent molecular assembly process by SIS. Owing to the molecular-level engineering offered by this method, in situ synthesized —Al—OH sites in PMMA microdomains formed by treating PS-b-PMMA with 1 or 2 cycles of $Al_2O_3$SIS may be utilized to seed the growth of other inorganic materials which do not have direct selective chemistry with pure PS-b-PMMA polymer, e.g., ZnO, MgO, $SiO_2$, etc.

In yet another embodiment, SIS of ZnO was performed in BCP after first seeding with 1-2 cycles of $Al_2O_3$SIS. FIG. 4d shows the AFM image of the pattern resulting from 1 $Al_2O_3$SIS cycle (timing: 60/300/60/300 seconds) followed by 3 ZnO SIS ($DEZ/H_2O$) cycles (timing; 300/300/300/300 seconds). The pattern is clearer than the image shown in FIG. 4c. The difference of height of the cylinders shown in FIGS. 4c and 4d was confirmed with corresponding EDAX line scans. The lateral size of the cylinders was measured to be 19.4±3.2 nm and EDAX measurements confirmed the spatial localization of Zn.

Figures 5A, 5B, 5C, 5D:
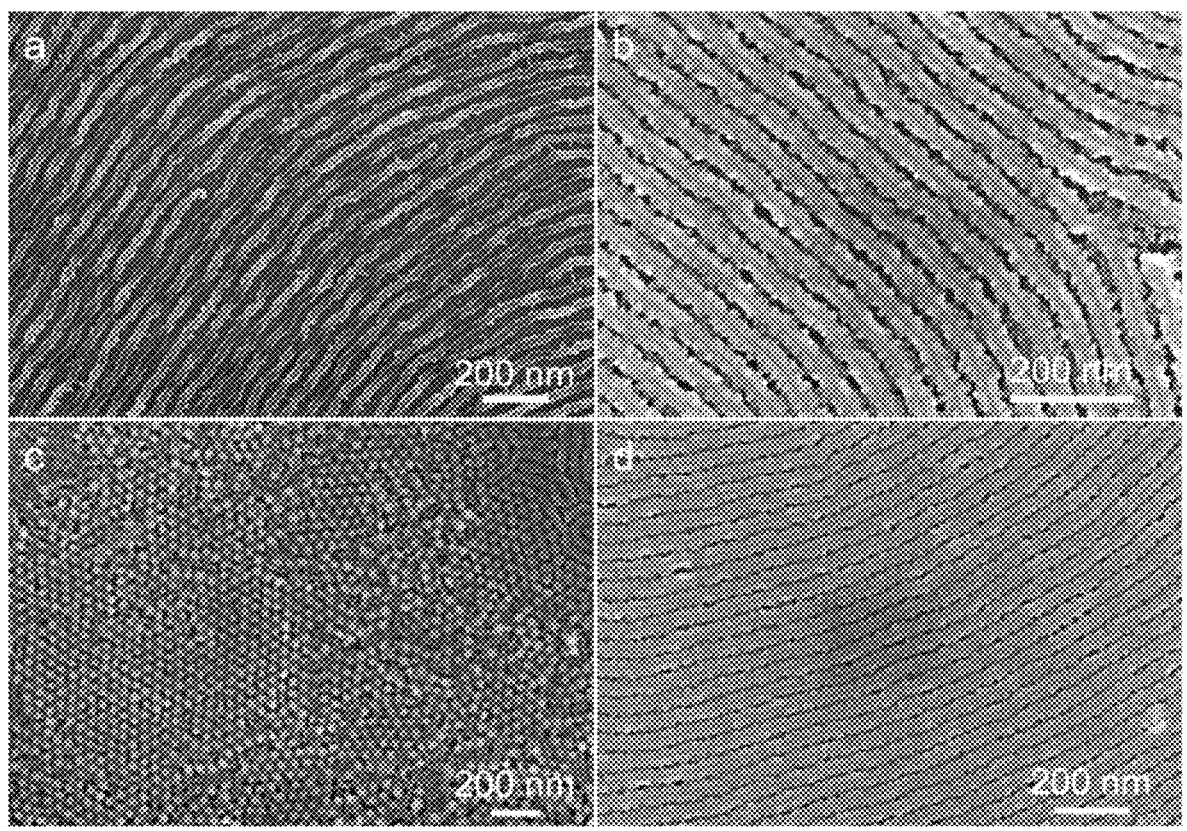
FIG. 5a-5d are FESEM images of nanopatterns formed on a Si wafer templated by a PS-b-PMMA scaffold following 1 cycle of $Al_2O_3$ SIS followed by 10 cycles of tungsten (W) SIS (FIG. 5a); 1 cycle of $Al_2O_3$ SIS followed by 20 cycles of W ALD (FIGS. 5b-5c); and 2 cycles of $Al_2O_3$ SIS followed by 20 cycles of W SIS (FIG. 5d)

In another embodiment, the process was performed with tungsten (W) SIS at 85° C. onto —AlOH seeded PS-b-PMMA scaffold thin features using SIS precursors tungsten hexafluoride $WF_6$ and disilane $Si_2H_6$ ($WF_6$, >99.9% and $Si_2H_6$ 99.998%, Sigma-Aldrich). FIG. 5a shows the organized nanostructure formed from 1 $Al_2O_3$ ALD cycle followed by 10 W SIS cycles (timing 60/300/60/300 seconds) and an $O_2$ plasma treatment. Compared with the nanofeatures resulting from 1 SIS $Al_2O_3$ cycle (FIG. 2a), the cylinder size is much larger (diameter 25.9±1.9 nm) and broken points are not observed. Due to the inhibited growth of SIS W on pure polymers, a control sample was prepared with 10 W SIS cycles but no $Al_2O_3$SIS, which showed no detectable features by SEM.

Nanocylinders of greater diameter may be generated by performing additional W SIS cycles, e.g., 20 cycles, as illustrated by FIGS. 5b and 5d. As observed in the SEM image in FIG. 5b, the cylinders (diameter 41.8±2.7 nm) have a smooth top surface and rougher structures along their sidewalls suggesting that the preferential reaction of W SIS on the surface of the PMMA domains compared with inside of the domains. This may be due to the relatively slow diffusion of the larger W SIS precursor ($WF_6$), particularly with increasing numbers of SIS cycles which decrease the diameter of the polymer pores and voids. The rough edges of the nanocylinders are ascribed to island-growth behavior of the W with the SIS process. Nevertheless, the gap between the PMMA domains is clear, which indicates again that the W growth originates within the PMMA domains and progresses as a self-limited heterogeneous surface reaction.

The presence of W was confirmed by XRF. Moreover, the conductivity of the PS-b-PMMA-Al—OH nanocomposite on a $SiO_2$/Si scaffold after 20 cycles of W SIS treatment became detectable by two-point I-V measurement, further supporting the incorporation of W metal. As shown in FIG. 5c, dense nanoposts with dimensions of 40.3±3.1 nm were also observed on the sample shown in FIG. 5b, which again confirms the applicability of the process for templating different morphologies of inorganic structures in BCPs. For the sample prepared with 2 cycles of $Al_2O_3$ and 20 cycles of W SIS, nanocylinder features with larger diameters (43.6±3.1 nm) were observed due to the greater density of Al—OH sites. Although the nanocylinders resulting from 20 cycles of W are larger than the PMMA domain size, the center-to-center spacing of those features, which are 55.7±3.2 nm and 55.4±3.0 nm for samples with 1 and 2 cycles $Al_2O_3$ seeds, respectively, is consistent with the corresponding periodicity in the original PS-b-PMMA features.

The present methods may be extended to include combining a block copolymer material incorporating a conjugated semiconducting polymer such as poly(3-hexylthiophene) (P3HT) with an SIS material that is a wide-bandgap semiconductor such as $TiO_2$ or ZnO. The patterned nanostructure would offer a large surface area p-n junction for efficient separation of photo (solar) generated excitons. The composite material may be incorporated into organic-inorganic hybrid photovoltaics which could achieve enhanced efficiency. Other applications are recognizable to those of skill in the art and may range from photonic crystals to various membranes.

The foregoing description of embodiments of the present invention has been presented for purposes of illustration and description. It is not intended to be exhaustive or to limit the present invention to the precise form disclosed, and modifications and variations are possible in light of the above teachings or may be acquired from practice of the present invention. The embodiments were chosen and described in order to explain the principles of the present invention and its practical application to enable one skilled in the art to utilize the present invention in various embodiments, and with various modifications, as are suited to the particular use contemplated.

What is claimed is:

1. A nanocomposite organic/inorganic material, comprising:
   a block copolymer comprising a first polymer and a second polymer covalently bonded to the first polymer, the first polymer defining a plurality of self-assembled ordered microdomains disposed within the second polymer, the first polymer including at least one functional group absent from the second polymer; and
   an inorganic material substantially disposed within each of the plurality of ordered microdomains of the first polymer, the material comprising at least one metal oxide selectively bound to at least one functional group,
   wherein the at least one metal oxide is not bound to the second polymer.

2. The nanocomposite material of claim 1, wherein the at least one functional group is selected from a group consisting of: a carbonyl group, an ester group, an ether group, a pyridine group, and a hydroxyl group.

3. The nanocomposite material of claim 1, wherein the inorganic material includes a second metal oxide selectively bound to a first metal oxide.

4. The nanocomposite material of claim 1, wherein the first polymer comprises a hole-transport polymer and the inorganic material is characterized by a semiconductor, and wherein the nanocomposite material is integrated in an organic-inorganic hybrid photovoltaic device.

5. The nanocomposite material of claim 1, wherein the first polymer comprises an electron- or ion-conducting polymer and wherein the inorganic material provides structural support for a separation membrane in a battery or capacitor.

6. A nanocomposite organic/inorganic material, comprising:
   a block copolymer including a first polymer free of a reactive functional group and a second polymer forming a plurality of ordered polymer nanoscale domains characterized by the reactive functional group and having a configuration; and
   an inorganic material substantially disposed within the configuration of the second polymer, the inorganic material comprising at least one metal oxide selectively bound to the reactive functional group and forming a plurality of inorganic features,
   wherein the at least one metal oxide is not bound to the first polymer.

7. The nanocomposite material of claim 6, wherein the at least one reactive functional group is selected from a group consisting of: a carbonyl group, an ester group, an ether group, a pyridine group and a hydroxyl group.

8. The nanocomposite material of claim 6, wherein the inorganic material includes a second metal oxide selectively bound to a first metal oxide.

9. The nanocomposite material of claim 6, wherein the first polymer comprises a hole-transport polymer and the inorganic material is characterized by a semiconductor, and wherein the nanocomposite material is integrated in an organic-inorganic hybrid photovoltaic device.

10. The nanocomposite material of claim 6, wherein the first polymer comprises an electron- or ion-conducting polymer and wherein the inorganic material provides structural support for a separation membrane in a battery or capacitor.

11. The nanocomposite material of claim 6, wherein the plurality of ordered polymer nanoscale domains' configuration is a plurality of cylinders or inverse cylinders and the plurality of inorganic features are a plurality of metal cylinders of the first metal.

12. The nanocomposite material of claim 11, wherein the plurality of metal cylinders are an array emitter or a field emitter.

13. The nanocomposite material of claim 11, wherein the plurality of metal cylinders form a three-dimensional electrical contact infiltrating organic semiconductor features.

14. A nanocomposite organic/inorganic material, comprising:
    a block copolymer including a first polymer free of a reactive functional group and a second polymer forming a plurality of ordered polymer nanoscale domains characterized by the reactive functional group and having a configuration; and
    an inorganic material substantially disposed within the configuration of the second polymer, the inorganic material comprising at least one metal oxide selectively bound to the reactive functional group and forming a plurality of inorganic features,
    the first polymer comprises a hole-transport polymer and the inorganic material is characterized by a semiconductor, and wherein the nanocomposite material is integrated in an organic-inorganic hybrid photovoltaic device,
    wherein the at least one metal oxide is not bound to the first polymer.

15. The nanocomposite material of claim 14, wherein the at least one reactive functional group is selected from a group consisting of: a carbonyl group, an ester group, an ether group, a pyridine group and a hydroxyl group.

16. The nanocomposite material of claim 14, wherein the inorganic material includes a second metal oxide selectively bound to a first metal oxide.

17. The nanocomposite material of claim 14, wherein the first polymer comprises an electron- or ion-conducting polymer and wherein the inorganic material provides structural support for a separation membrane in a battery or capacitor.

18. The nanocomposite material of claim 14, wherein the plurality of ordered polymer nanoscale domains' configuration is a plurality of cylinders or inverse cylinders and the plurality of inorganic features are a plurality of metal cylinders of the first metal.

19. The nanocomposite material of claim 18, wherein the plurality of metal cylinders are an array emitter or a field emitter.

20. The nanocomposite material of claim 18, wherein the plurality of metal cylinders form a three-dimensional electrical contact infiltrating organic semiconductor features.

* * * * *